US 8,728,838 B2

United States Patent
Takahara

(10) Patent No.: US 8,728,838 B2
(45) Date of Patent: May 20, 2014

(54) ORGANIC ELECTROLUMINESCENT DISPLAY DEVICE AND METHOD OF PRODUCING THE SAME

(75) Inventor: Kazuhiro Takahara, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 762 days.

(21) Appl. No.: 13/017,979

(22) Filed: Jan. 31, 2011

(65) Prior Publication Data

US 2011/0124138 A1   May 26, 2011

Related U.S. Application Data

(62) Division of application No. 12/404,610, filed on Mar. 16, 2009, now abandoned.

(30) Foreign Application Priority Data

Mar. 17, 2008   (JP) ................................. 2008-068083

(51) Int. Cl.
    *H01L 33/00* (2010.01)
(52) U.S. Cl.
    USPC ................. 438/34; 438/23; 438/99; 438/795; 257/E33.055
(58) Field of Classification Search
    USPC ................. 438/34, 23, 99, 795; 258/E33.055
    See application file for complete search history.

(56) References Cited

U.S. PATENT DOCUMENTS

| 6,583,775 B1 | 6/2003 | Sekiya et al. |
| 2005/0068272 A1 | 3/2005 | Yoneda |
| 2005/0225253 A1 | 10/2005 | Yamada |
| 2006/0113549 A1 | 6/2006 | Den et al. |
| 2007/0054507 A1 | 3/2007 | Kaji et al. |
| 2008/0293208 A1 | 11/2008 | Kaji et al. |
| 2010/0144089 A1 | 6/2010 | Kaji et al. |

FOREIGN PATENT DOCUMENTS

| JP | 2003-66868 A | 3/2003 |
| JP | 2004-179138 A | 6/2004 |
| JP | 2005-300786 A | 10/2005 |
| JP | 2006-186319 A | 7/2006 |
| JP | 2007-73699 A | 3/2007 |
| JP | 2007-188099 A | 7/2007 |
| WO | 03/101158 A1 | 4/2003 |
| WO | 2006/033919 A2 | 3/2006 |

OTHER PUBLICATIONS

Communication, dated Feb. 28, 2012, issued by the Japanese Patent Office in corresponding Japanese Application No. 2008-068083.

*Primary Examiner* — Long Pham

(74) *Attorney, Agent, or Firm* — Sughrue Mion, PLLC

(57) ABSTRACT

An organic electroluminescent display device in which a plurality of light-emitting cells each having an organic electroluminescent portion are arranged on a substrate, wherein, for each of the light-emitting cells, a first transistor which controls energization on the organic electroluminescent portion, and a second transistor which switches a signal to be given to an input of the first transistor are disposed, active layers of the first and second transistors are formed by an amorphous oxide semiconductor, and, the first and second transistors are formed so that, when the first and second transistors are driven under same conditions, an amount of an output current of the first transistor is smaller than an amount of an output current of the second transistor.

2 Claims, 4 Drawing Sheets

[CURRENT-VOLTAGE CHARACTERISTICS]

[μ IS CONSTANT]

[μ IS DIFFERENTIATED]

[d IS CONSTANT]

[d IS DIFFERENTIATED]

[ε IS CONSTANT]

[ε IS DIFFERENTIATED]

ORGANIC ELECTROLUMINESCENT DISPLAY DEVICE AND METHOD OF PRODUCING THE SAME

CROSS-REFERENCE TO RELATED APPLICATIONS

This application is a divisional application of U.S. patent application Ser. No. 12/404,610, filed on Mar. 16, 2009. This application claims the benefit of Japanese Patent Application JP 2008-068083, filed Mar. 17, 2008, the entire content of which is hereby incorporated by reference, the same as if set forth at length.

FIELD OF THE INVENTION

The present invention relates to an organic electroluminescent display device in which a plurality of light-emitting cells each having an organic electroluminescent portion are arranged on a substrate.

BACKGROUND OF THE INVENTION

Usually, an organic electroluminescent (organic EL) display device which can be used in various display apparatuses is produced by using a process similar to a semiconductor production process, and forming light-emitting cells each having an organic electroluminescent portion on a substrate such as a semiconductor. The light-emitting cells are used for displaying pixels constituting an image or the like to be displayed, respectively.

The organic EL uses a phenomenon called injection electroluminescence in which light is emitted by recombination of an electron-hole pair. Since the luminescence principle is similar to that of an LED (Light-Emitting Diode), an organic EL portion is also called an OLED (Organic Light-Emitting Diode).

In order to surely control lighting/extinction of each of many light-emitting cells which are arranged two-dimensionally, usually, an active matrix drive system in which an independent active drive element such as a TFT (Thin Film Transistor) is disposed for each of the cells is used.

In the case of an organic electroluminescent display device, a circuit which is configured as shown in, for example, FIG. 8 of JP-A-2005-300786 (corresponding to US 2005/0225253 A1) is formed for each cell. Namely, a driving transistor (80) which is connected in series to an organic EL element (70) is disposed in order to control energization of the element, and a capacitor for holding a signal and a selection transistor (10) for switching the signal are connected to the input of the driving transistor.

At a timing when a signal which is to be displayed in the cell appears, the selection transistor is temporarily turned on, and the necessary signal is held by the capacitor. Therefore, the driving transistor for the cell supplies a current corresponding to the input signal to the organic EL element, so that the luminous intensity of the organic EL element is controlled by the current.

In an organic EL display device in which many light-emitting cells are arranged, it is important to increase the aperture ratio of each cell. More specifically, each cell tends to have a small area, and therefore a sufficient luminous intensity cannot be obtained and a clear display is not enabled unless the area ratio of the luminous region to the cell is increased as far as possible. Actually, when transistors or the like of a circuit for driving cells are increased in size, light is blocked by the transistors or the like, so that the aperture ratio of each cell is lowered and the luminous intensity is reduced.

In the prior art disclosed in JP-A-2005-300786 (corresponding to US 2005/0225253 A1), in order to enable the channel of the driving transistor to be shortened, therefore, the carrier mobility of the driving transistor is made lower than that of the selection transistor. Specifically, a silicon-based semiconductor is used as the active layers (regions where the channel is formed) of the transistors, and their carrier mobilities can be changed depending on the difference of their grain sizes.

JP-A-2006-186319 (corresponding to US 2006/0113549 A1) discloses a luminescence device which is configured by using an amorphous oxide semiconductor in the active layer of a transistor.

SUMMARY OF THE INVENTION

In the case where transistors (TFTs) are configured by using polysilicon as disclosed in JP-A-2005-300786 (corresponding to US 2005/0225253 A1), however, the mobility is as large as about 100 to 200, and hence the channel length (L) of a driving transistor must be increased so that the current amount is restricted. When the channel length is large, the ratio of the region of the transistor to the area of a cell is large, and hence the aperture ratio is lowered. In the case where an organic electroluminescent display device for realizing a high-definition display apparatus is to be formed, therefore, a transistor cannot be sometimes placed for each cell.

In the case where transistors (TFTs) are configured by using polysilicon, the mobilities can be adjusted by the laser annealing process. However, it is difficult to perform the annealing process on all cells at once, and hence the characteristics of the transistors such as the mobility or the threshold voltage are largely dispersed, with the result that display unevenness easily occurs.

The invention has been conducted in view of the above-mentioned circumstances. It is an object of the invention to provide an organic electroluminescent display device in which the aperture ratio of each of light-emitting cells can be prevented from being reduced, characteristic variations of the light-emitting cells can be suppressed, and a bright high-quality display is enabled at low power consumption.

The organic electroluminescent display device of the invention is an organic electroluminescent display device in which a plurality of light-emitting cells each having an organic electroluminescent portion are arranged on a substrate, wherein, for each of the light-emitting cells, a first transistor which controls energization on the organic electroluminescent portion, and a second transistor which switches a signal to be given to an input of the first transistor are disposed, active layers of the first and second transistors are formed by an amorphous oxide semiconductor, and, the first and second transistors are formed so that, when the first and second transistors are driven under same conditions, a condition of (an amount of an output current of the first transistor)<(an amount of an output current of the second transistor) is satisfied.

In the organic electroluminescent display device of the invention, (a mobility of the first transistor)<(a mobility of the second transistor) is attained.

In the organic electroluminescent display device of the invention, (an electron carrier concentration of the active layer of the first transistor)<(an electron carrier concentration of the active layer of the second transistor) is attained.

In the organic electroluminescent display device of the invention, (a thickness of a gate insulating film of the first transistor)>(a thickness of a gate insulating film of the second transistor) is attained.

In the organic electroluminescent display device of the invention, (a dielectric constant of a gate insulating film of the first transistor)<(a dielectric constant of a gate insulating film of the second transistor) is attained.

In the organic electroluminescent display device of the invention, the amorphous oxide semiconductor is an In—Ga—Zn—O or In—Zn—O oxide semiconductor.

The method of producing an organic electroluminescent display device of the invention is a method of producing an organic electroluminescent display device in which a plurality of light-emitting cells each having an organic electroluminescent portion are arranged on a substrate, and, for each of the light-emitting cells, a first transistor which controls energization on the organic electroluminescent portion, and a second transistor which switches a signal to be given to an input of the first transistor are disposed, wherein the method includes: a first step of forming an active layer of the first transistor and an active layer of the second transistor by an amorphous oxide semiconductor, on the substrate; and a second step of, after only the active layer of the first transistor is covered by a light-blocking mask, irradiating the active layer of the second transistor with ultraviolet rays or plasma to make an electron carrier concentration of the active layer of the second transistor higher than an electron carrier concentration of the active layer of the first transistor.

The method of producing an organic electroluminescent display device of the invention is a method of producing an organic electroluminescent display device in which a plurality of light-emitting cells each having an organic electroluminescent portion are arranged on a substrate, and, for each of the light-emitting cells, a first transistor which controls energization on the organic electroluminescent portion, and a second transistor which switches a signal to be given to an input of the first transistor are disposed, wherein the method includes: a first step of forming an active layer of the first transistor and an active layer of the second transistor by an amorphous oxide semiconductor, on the substrate; a second step of, after only the active layer of the first transistor is covered by a light-blocking mask, irradiating the active layer of the second transistor with ultraviolet rays or plasma; and a third step of, after only the active layer of the second transistor is covered by a light-blocking mask, irradiating the active layer of the first transistor with ultraviolet rays or plasma, and (an irradiation amount of the ultraviolet rays or plasma on the active layer of the first transistor)<(an irradiation amount of the ultraviolet rays or plasma on the active layer of the second transistor) is set, whereby an electron carrier concentration of the active layer of the second transistor is made higher than an electron carrier concentration of the active layer of the first transistor.

According to the organic electroluminescent display device of the invention, the aperture ratio of each of the light-emitting cells can be prevented from being reduced, and a bright high-quality display is enabled at low power consumption. Furthermore, characteristic variations of the light-emitting cells can be suppressed, and also display unevenness can be suppressed.

DETAILED DESCRIPTION OF THE INVENTION

A specific embodiment of the organic electroluminescent display device of the invention and the method of producing it will be described with reference to FIGS. 1 to 8.

Figure 1:
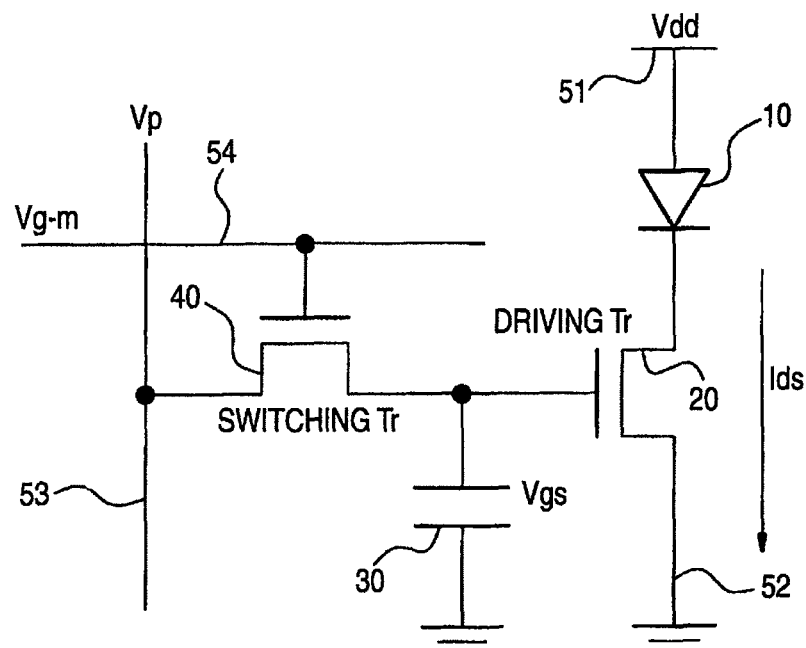
FIG. 1 is an electrical circuit diagram showing the basic circuit configuration of one of a plurality of light-emitting cells included in an organic electroluminescent display device of an embodiment.
Figure 2:
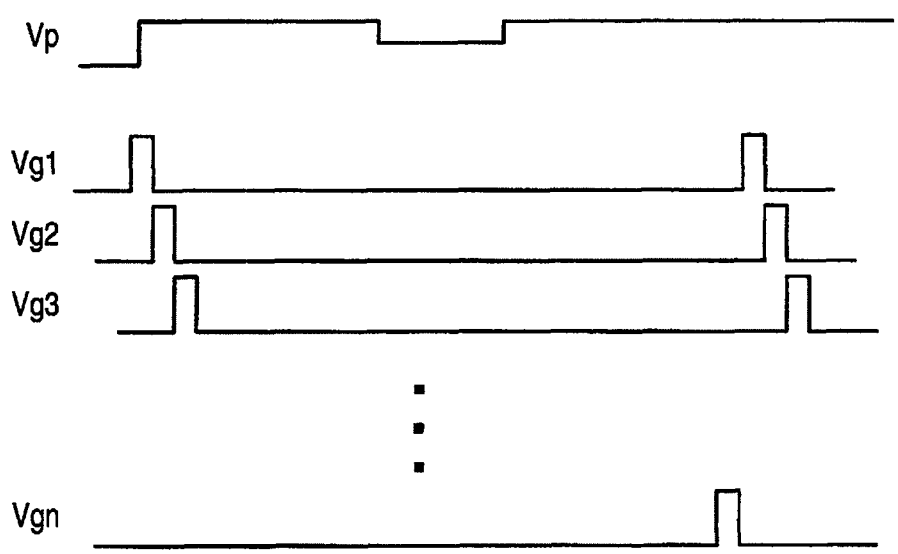
FIG. 2 is a timing chart showing examples of signals which are applied to the circuit shown in FIG. 1.
Figure 3:
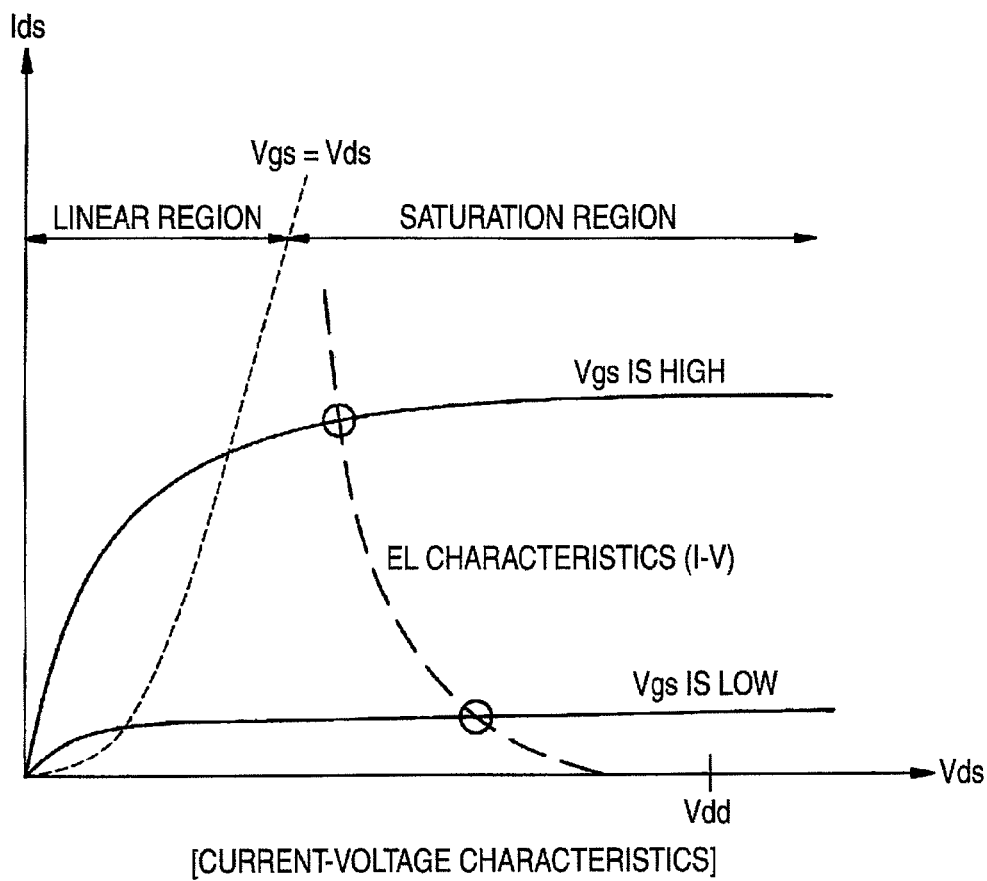
FIG. 3 is a graph showing current-voltage characteristics of a transistor included in the circuit shown in FIG. 1.
Figure 4A:
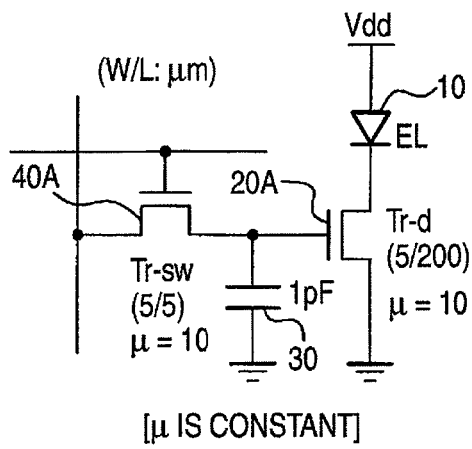
FIGS. 4A and 4B are electrical circuit diagrams showing configuration examples of one of the plurality of light-emitting cells included in the organic electroluminescent display device of the embodiment.
Figure 4B:
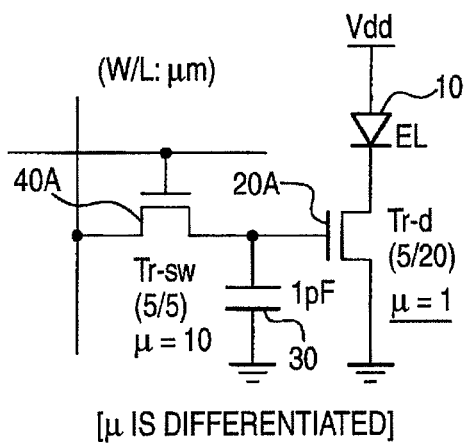
Figure 6A:
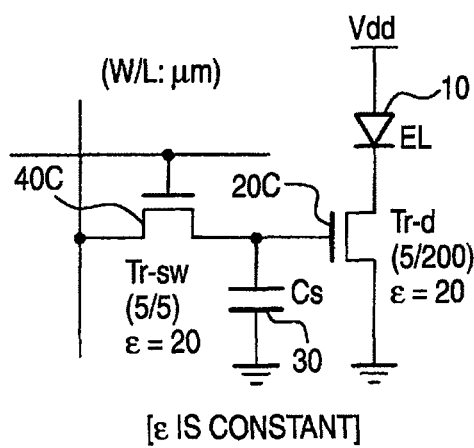
FIGS. 6A and 6B are electrical circuit diagrams showing configuration examples of one of the plurality of light-emitting cells included in the organic electroluminescent display device of the embodiment.
Figure 6B:
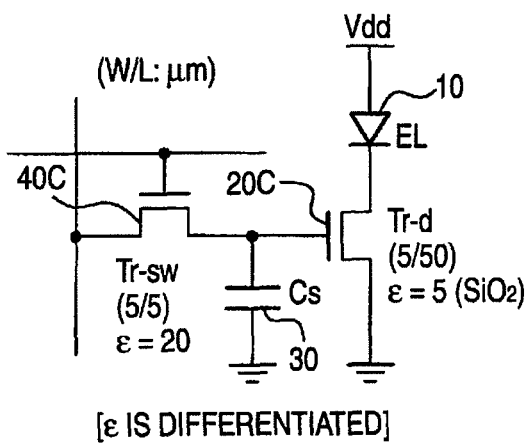
Figure 7:
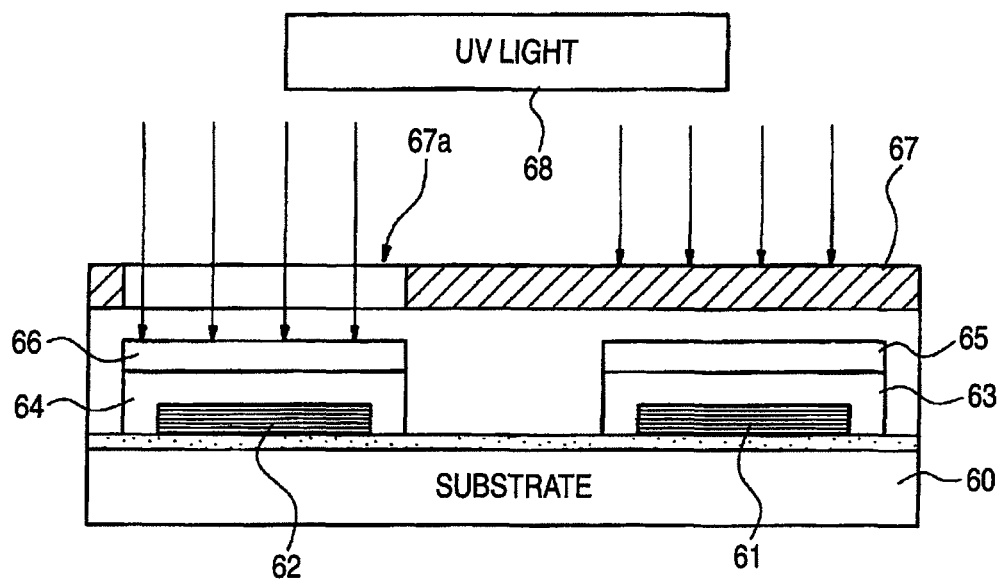
FIG. 7 is a longitudinal section view showing specific example 1 of a production process of forming two transistors having different characteristics included in the circuit shown in FIG. 4B, on one substrate.
Figure 8:
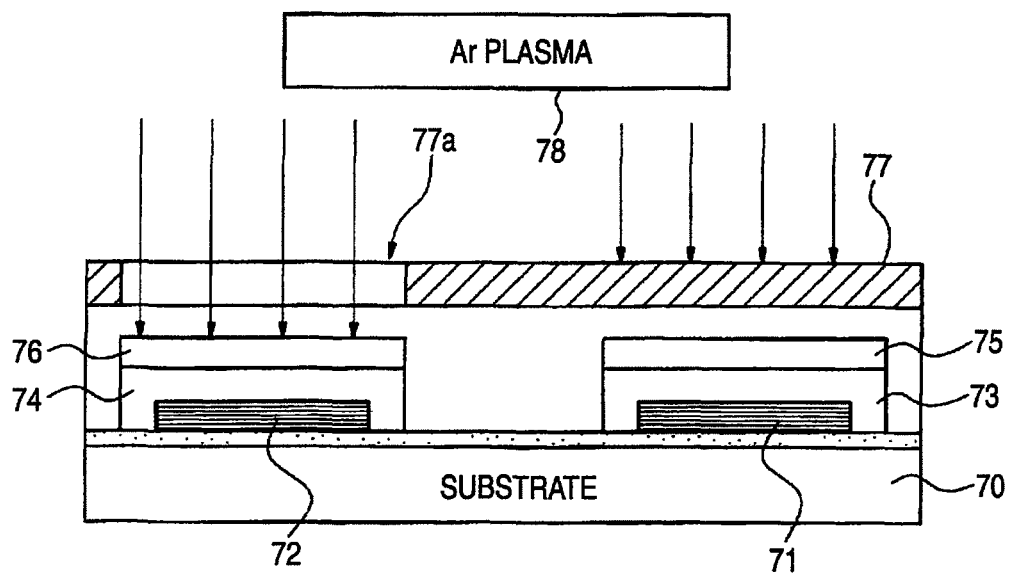
FIG. 8 is a longitudinal section view showing specific example 2 of the production process of forming two transistors having different characteristics included in the circuit shown in FIG. 4B, on one substrate.

FIG. 1 is an electrical circuit diagram showing the basic circuit configuration of one of many light-emitting cells included in the organic electroluminescent display device of the embodiment, FIG. 2 is a timing chart showing examples of signals which are applied to the circuit shown in FIG. 1, FIG. 3 is a graph showing current-voltage characteristics of a transistor included in the circuit shown in FIG. 1, FIGS. 4 to 6 are electrical circuit diagrams respectively showing three circuit configurations of one of the many light-emitting cells included in the organic electroluminescent display device of the embodiment, FIG. 7 is a longitudinal section view showing specific example 1 of a production process of forming two transistors having different characteristics included in the circuit shown in FIG. 4B, on one substrate, and FIG. 8 is a longitudinal section view showing specific example 2 of the production process of forming two transistors having different characteristics included in the circuit shown in FIG. 4B, on one substrate.

In the embodiment, it is assumed that the invention is applied to an organic electroluminescent display device in which, in the same manner as a display panel of a usual display apparatus, many light-emitting cells having the same structure are arranged two-dimensionally at regular intervals in the horizontal and vertical directions. It is assumed also that, in order to surely control lighting/extinction and the amount of luminescence of each of the many light-emitting cells which are arranged two-dimensionally, an active matrix drive system in which an independent active drive element is disposed for each of the cells is employed.

Namely, each of the many light-emitting cells constituting the organic electroluminescent display device has the circuit configuration shown in FIG. 1. Many light-emitting cells having the configuration shown in FIG. 1 are arranged on one substrate by production steps which are similar to those of the semiconductor production process, thereby configuring one organic electroluminescent display device. When an image is to be displayed by the organic electroluminescent display device, usually, each of pixels constituting the image is displayed by luminescence of each of the light-emitting cells. When a color image is to be displayed, three light-emitting cells which respectively emit light of the colors of R (red), G (green), and B (blue) are used for displaying one pixel.

Referring to FIG. 1, each of the light-emitting cells includes an organic EL element (OLED) 10 functioning as an organic electroluminescent portion, a driving transistor 20, a capacitor 30, and a switching transistor 40. The organic EL element 10 has an anode and a cathode in the same manner as a light-emitting diode. The anode of the organic EL element 10 is connected to a power source line (to which a DC voltage Vdd is applied) 51, and the cathode is connected to a ground line 52 via the driving transistor 20. Namely, a current Ids flowing through the organic EL element 10 is controlled by the driving transistor 20.

In order to hold the input voltage (Vgs: the gate-source voltage) of the driving transistor 20, the capacitor 30 is connected between the gate electrode of the driving transistor 20 and the ground line.

A program voltage Vp which is used for determining the current Ids flowing through the organic EL element 10 of each of the light-emitting cells is applied to a signal line 53, so that the program voltage Vp is applied through the signal line 53 to the gate electrode of the driving transistor 20 and the capacitor 30 via the switching transistor 40 of each light-emitting cell. Namely, the switching transistor 40 is on-off controlled in order to selectively apply the program voltage Vp to the light-emitting cell. The switching transistor 40 is on-off controlled by a selection signal Vg-m which is applied to a selection control line 54.

In the case where a first light-emitting cell, a second light-emitting cell, a third light-emitting cell, . . . , and an n-th light-emitting cell are sequentially arranged, for example, signals which are temporarily raised to a high level at slightly staggered timings as signals Vg1, Vg2, Vg3, . . . , Vgn shown in FIG. 2 are applied to the cells as the selection signal Vg-m shown in FIG. 1. When the selection signal Vg-m is at the high level, the switching transistor 40 is turned on, and the program voltage Vp is supplied to the gate electrode of the driving transistor 20. At this time, the capacitor 30 is charged or discharged. Therefore, the program voltage Vp is held by the capacitor 30, so that, even after the switching transistor 40 is turned off, the gate voltage (Vgs) of the driving transistor 20 is maintained constant.

FIG. 3 shows characteristics indicating relationships between the current Ids and the voltage Vds (the drain-source voltage) in the driving transistor 20 shown in FIG. 1. As shown in FIG. 3, when the gate voltage Vgs of the driving transistor 20 is low, the current Ids which is the output current of the driving transistor 20 is reduced, and, when the gate voltage Vgs is high, the current Ids is increased. When the current Ids is small, the amount of luminescence of the organic EL element 10 is reduced, and, when the current Ids is large, the amount of luminescence of the organic EL element 10 is increased.

Also the switching transistor 40 has current-voltage characteristics similar to that shown in FIG. 3. While the flow of a small current (Ids) is sufficient for the driving transistor 20, however, the current flowing through the switching transistor 40 must be sufficiently large. Moreover, the on/off state of the switching transistor 40 must be switched over at high speed. Therefore, the driving transistor 20 and the switching transistor 40 are formed so that, when the driving transistor 20 and the switching transistor 40 are driven under same conditions, a condition of (the amount of the output current (hereinafter, such an amount is often referred to as "output current amount") of the driving transistor 20)<(the output current amount of the switching transistor 40) is satisfied.

In the embodiment, it is assumed that the driving transistor 20 is used in the saturation region. In the case where a transistor is used in the saturation region, the output current Ids of the transistor is indicated by following Expression (1).

$$Ids = (1/2) \cdot \mu \cdot Cox \cdot (W/L) \cdot (Vgs - Vth)^2 \quad (1),$$

$$Vp = Vgs - Vth, \text{ and}$$

$$Cox = \epsilon_0 \cdot \epsilon_r / d.$$

In the expressions,
μ: the mobility,
W: the channel width of the transistor,
L: the channel length (the distance between the drain and the source) of the transistor,
Vth: the threshold voltage of the transistor,
Vp: the program voltage,
$\epsilon_0 \cdot \epsilon_r$: the dielectric constant of a material of the gate insulating film, and
d: the thickness of the gate insulating film.

Therefore, parameters which can be used in the adjustment of the current Ids are W/L, μ, d, $\epsilon_r$, and Vp. When these parameters are adjusted, it is possible to adjust the output current amount of the transistor.

As described above, the switching transistor 40 must perform a high-speed switching operation. Therefore, the output current amount of the transistor must be sufficiently larger than that of the driving transistor 20. Usually, the transistors are designed so that the channel length L of the driving transistor 20 is sufficiently larger than that of the switching transistor 40. However, the increase of the channel length L causes the aperture ratio to be reduced, and hence is not preferable.

When the program voltage Vp is made low, the channel length L can be made short. In this case, however, the noise level is increased to adversely affect the display quality, and hence the program voltage Vp cannot be lowered very much.

In the embodiment, therefore, a condition of (the mobility μ of the driving transistor 20)<(the mobility μ of the switching transistor 40) is set, so that, while the condition of (the output current amount of the driving transistor 20)<(the output current amount of the switching transistor 40) is kept to be realized, the channel length L of the driving transistor 20 can be shortened.

In the embodiment, the active layers of the driving transistor 20 and the switching transistor 40 are formed by an amorphous oxide semiconductor, whereby the adjustments of the mobilities of the transistors can be facilitated, and characteristic variations of the transistors due to the adjustments of the mobilities can be suppressed. As the amorphous oxide semiconductor, an oxide semiconductor such as IZO (In—Zn—O) or IGZO (In—Ga—Zn—O) may be used.

For example, it is assumed that the current Ids is a fixed value, and Vp, W, and Cox are fixed values. According to Expression (1), when the mobility μ of the driving transistor 20 is reduced, the channel length L can be shortened, and hence the aperture ratio of the cell can be increased. When the mobility μ is reduced, the response speed is lowered, but there arises no problem because the current in the driving transistor 20 is required to be changed at high speed. By contrast, with respect to the switching transistor 40, since the selection state of the cell to which the program voltage (Vp) is to be applied must be switched over at high speed, preferably, the mobility μ is increased so that a high-speed operation is enabled. The channel size of the switching transistor 40 is originally very smaller than that of the driving transistor 20. Even when the mobility μ of the switching transistor 40 is increased, therefore, the aperture ratio is hardly affected.

As a method of adjusting the mobilities μ of the driving transistor 20 and the switching transistor 40, it may be contemplated that the active layers respectively constituting the driving transistor 20 and the switching transistor 40 are formed so that their electron carrier concentrations are different from each other. The method will be described later.

FIGS. 4 to 6 show three configuration examples of one light-emitting cell which is configured by application of the above-described improvement, respectively.

In the configuration examples shown in FIGS. 4A and 4B, in a similar manner to the case of FIG. 1, the organic EL element 10, a driving transistor 20A, the capacitor 30, and a switching transistor 40A are formed in one light-emitting cell. The case where the light-emitting cell is designed so that the output current amount of the switching transistor 40A is 40 times that of the driving transistor 20A will be considered.

In this case, when the output current amounts are to be changed by changing only the channel lengths L of the switching transistor 40A and the driving transistor 20A, the channel length L of the driving transistor 20A must be 40 times that of the switching transistor 40A. In FIG. 4A, when the channel width W of the switching transistor 40A is 5 (μm) and the channel length L is 5 (μm), for example, the channel width W of the driving transistor 20A is 5 (μm) and the channel length L is 200 (μm). At his time, it is assumed that the mobilities μ of the driving transistor 20A and the switching transistor 40A are set to "10".

In contrast to the configuration example shown in FIG. 4A, when the mobility μ of the driving transistor 20A is reduced to one tenth or "1", the channel length L of the driving transistor 20A can be reduced to one tenth of that of FIG. 4A or 20 (μm) as shown in FIG. 4B. Namely, when the mobility μ of the driving transistor 20A is made smaller than that of the switching transistor 40A, the channel length L of the driving transistor 20A can be reduced more than that of FIG. 4A, and therefore the aperture ratio can be improved.

Figure 5A:
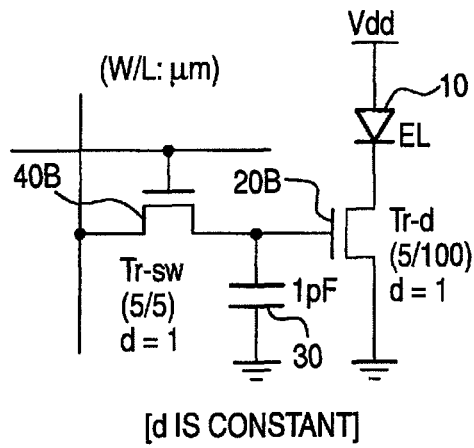
FIGS. 5A and 5B are electrical circuit diagrams showing configuration examples of one of the plurality of light-emitting cells included in the organic electroluminescent display device of the embodiment.
Figure 5B:
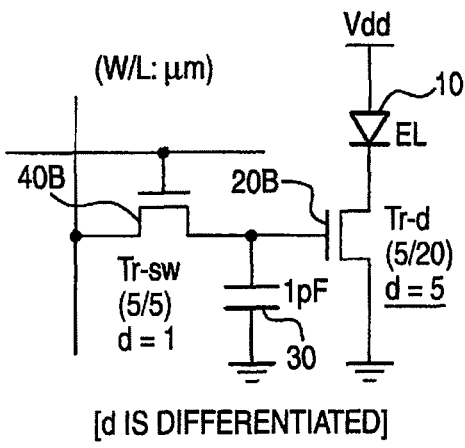

In the configuration examples shown in FIGS. 5A and 5B, in a similar manner to the case of FIG. 1, the organic EL element 10, a driving transistor 20B, the capacitor 30, and a switching transistor 40B are formed in one light-emitting cell. The case where the light-emitting cell is designed so that the output current amount of the switching transistor 40B is 20 times that of the driving transistor 20B will be considered.

In this case, when the output current amounts are to be changed by changing only the channel lengths L of the switching transistor 40B and the driving transistor 20B, the channel length L of the driving transistor 20B must be 20 times that of the switching transistor 40B. In FIG. 5A, when the channel width W of the switching transistor 40B is 5 (μm) and the channel length L is 5 (μm), for example, the channel width W of the driving transistor 20B is 5 (μm) and the channel length L is 100 (μm). At his time, it is assumed that the thicknesses d of the gate insulating films (hereinafter, such a thickness is often referred to as "gate insulating film thickness") of the driving transistor 20B and the switching transistor 40B are set to "1".

In contrast to the configuration example shown in FIG. 5A, when the gate insulating film thickness d of the driving transistor 20B is increased five times, the channel length L of the driving transistor 20B can be reduced to one fifth of that of FIG. 5A or 20 (μm) as shown in FIG. 5B. Namely, when the gate insulating film thickness d of the driving transistor 20B is made larger than that of the switching transistor 40B, the channel length L of the driving transistor 20B can be reduced more than that of FIG. 5A, and therefore the aperture ratio can be improved.

Actually, the gate insulating film thickness d cannot be changed by a very large degree, and hence the aperture ratio cannot be sufficiently improved only by adjusting the gate insulating film thickness d. In the case where a practical device is to be configured, therefore, the driving transistor 20A and switching transistor 40A which are different from each other in mobility μ are formed in a similar manner to FIG. 4B, and then a condition of (the gate insulating film thickness d of the driving transistor 20A)>(the gate insulating film thickness d of the switching transistor 40A) is set. According to the configuration, as compared with the case where only the mobilities μ are adjusted, the channel length L of the driving transistor 20A can be further shortened, and therefore the aperture ratio can be further improved.

In the configuration examples shown in FIGS. 6A and 6B, in a similar manner to the case of FIG. 1, the organic EL element 10, a driving transistor 20C, the capacitor 30, and a switching transistor 40C are formed in one light-emitting cell. The case where the light-emitting cell is designed so that the output current amount of the switching transistor 40C is 40 times that of the driving transistor 20C will be considered.

In this case, when the output current amounts are to be changed by changing only the channel lengths L of the switching transistor 40C and the driving transistor 20C, the channel length L of the driving transistor 20C must be 40 times that of the switching transistor 40C. In FIG. 6A, when the channel width W of the switching transistor 40C is 5 (μm) and the channel length L is 5 (μm), for example, the channel width W of the driving transistor 20C is 5 (μm) and the channel length L is 200 (μm). At his time, it is assumed that the dielectric constants ∈ of the gate insulating films (hereinafter, such a dielectric constant is often referred to as "gate insulating film dielectric constant") of the driving transistor 20C and the switching transistor 40C are set to "20".

In contrast to the configuration example shown in FIG. 6A, when the gate insulating film dielectric constant ∈ of the driving transistor 20C is reduced to one fourth, the channel length L of the driving transistor 20C can be reduced to one fourth of that of FIG. 6A or 50 (μm) as shown in FIG. 6B. Namely, when the gate insulating film dielectric constant ∈ of the driving transistor 20C is made smaller than that of the switching transistor 40C, the channel length L of the driving transistor 20C can be reduced more than that of FIG. 6A, and therefore the aperture ratio can be improved.

Actually, since materials which can be used as a gate insulating film are restricted, it is difficult to largely change the gate insulating film dielectric constant ∈, and hence the aperture ratio cannot be sufficiently improved only by adjusting the gate insulating film dielectric constant ∈. In the case where a practical device is to be configured, therefore, the driving transistor 20A and switching transistor 40A which are different from each other in mobility μ are formed in a similar manner to FIG. 4B, and then a condition of (the gate insulating film dielectric constant ∈ of the driving transistor 20A)<(the gate insulating film dielectric constant ∈ of the switching transistor 40A) is set. According to the configuration, as compared with the case where only the mobilities μ are adjusted, the channel length L of the driving transistor 20A can be further shortened, and therefore the aperture ratio can be further improved.

Among the gate insulating film dielectric constants ∈ of materials ($SiO_2$, SiON, and SiN) which can be used as a gate insulating film, there is a relationship of "$SiO_2$<SiON<SiN". Therefore, it is contemplated that, for example, "$SiO_2$" is employed as the material of the gate insulating film of the driving transistor 20C shown in FIG. 6B, and "SiON" or "SiN" is employed as the material of the gate insulating film of the switching transistor 40C.

When the adjustment of the mobilities μ such as shown in FIG. 4B, that of the gate insulating film thicknesses d such as shown in FIG. 5B, and that of the gate insulating film dielectric constants ∈ such as shown in FIG. 6B are combined with one another to form the driving transistor 20 and the switching transistor 40 of a necessary size, the aperture ratio can be further improved.

Next, specific examples of a production process which can be used for producing elements that are different from each other in electron carrier concentration, as the driving transistor 20 and the switching transistor 40 will be described.

SPECIFIC EXAMPLE 1 OF PRODUCTION PROCESS

As shown in FIG. 7, an insulating film is formed on a substrate 60, and thereafter gate electrodes 61, 62 constituting the transistors are formed thereon by film formation and patterning of an electrode material. Then, gate insulating films 63, 64 are formed thereon by film formation and patterning of an insulating material. Next, two active layers 65, 66 are formed thereon. The formation of the active layers 65, 66 is processed in the following manner.

While using a polycrystalline sintered body having a composition of $InGaZnO_4$ as a target, the process is performed by the RF magnetron sputtering vacuum deposition method. In this example, the following conditions are employed:
Flow rate of argon (Ar): 12 sccm,
Flow rate of oxygen ($O_2$): 1.4 sccm,
RF power: 200 W, and
Pressure: 0.4 Pa.

As a result of the process, the active layer 65 has the following characteristics (the same is true in the active layer 66):
Electrical conductivity: $5.7 \times 10^{-3}$ $Scm^{-1}$,
Electron carrier concentration: $1 \times 10^{16}$ $cm^{-3}$, and
Hall mobility: 3.0 $cm^2/V \cdot S$.

As shown in FIG. 7, next, a UV mask 67 having an opening 67a in a place opposing to the active layer 66 is placed to cover the surface of the active layer 65, and only the active layer 66 is irradiated with UV light (11.6 mW) for one minute by using a UV light source 68.

As a result of the process, the active layer 66 has the following characteristics:
Electrical conductivity: $4.0 \times 10^1$ $Scm^{-1}$,
Electron carrier concentration: $3 \times 10^{19}$ $cm^{-3}$, and
Hall mobility: 8.3 $cm^2/V \cdot S$.

It is found that, when the UV irradiation amount is increased, also the electron carrier concentration is increased correspondingly with the irradiation amount.

Then, the driving transistor 20A is configured by using the thus formed active layer 65 as the channel, and the switching transistor 40A is configured by using the active layer 66 as the channel. According to the configuration, the mobility μ of the driving transistor 20A which uses the active layer 65 having the low electron carrier concentration is low, and that of the switching transistor 40A which uses the active layer 66 having the high electron carrier concentration is high. Therefore, the channel length of the driving transistor 20A is shortened to prevent the aperture ratio from being reduced, and the switching transistor 40 is enabled to perform a high-speed switching operation as in the configuration shown in, for example, FIG. 4B.

In the UV irradiation process such as shown in FIG. 7, many light-emitting cells can be collectively processed. Therefore, the characteristics of the cells are less dispersed, and display unevenness is reduced.

SPECIFIC EXAMPLE 2 OF PRODUCTION PROCESS

As shown in FIG. 8, an insulating film is formed on a substrate 70, and thereafter gate electrodes 71, 72 constituting the transistors are formed thereon by film formation and patterning of an electrode material. Then, gate insulating films 73, 74 are formed thereon by film formation and patterning of an insulating material. Next, two active layers 75, 76 are formed thereon. The formation of the active layers 75, 76 is processed in the following manner.

While using a polycrystalline sintered body having a composition of $InGaZnO_4$ as a target, the process is performed by the RF magnetron sputtering vacuum deposition method. In this example, the following conditions are employed:
Flow rate of argon (Ar): 12 sccm,
Flow rate of oxygen ($O_2$): 1.4 sccm,
RF power: 200 W, and
Pressure: 0.4 Pa.

As a result of the process, the active layer 75 has the following characteristics (the same is true in the active layer 76):
Electrical conductivity: $5.7 \times 10^{-3}$ $Scm^{-1}$,
Electron carrier concentration: $1 \times 10^{16}$ $cm^{-3}$, and
Hall mobility: 3.0 $cm^2/V \cdot S$.

As shown in FIG. 8, next, a mask 77 having an opening 77a in a place opposing to the active layer 76 is placed to cover the surface of the active layer 75, and only the active layer 76 is irradiated with Ar plasma (150 W, 0.1 Torr) for 30 seconds by using an Ar plasma apparatus 78.

As a result of the process, the active layer 76 has the following characteristics:
Electrical conductivity: $1.0 \times 10^2$ $Scm^{-1}$,
Electron carrier concentration: $8 \times 10^{19}$ $cm^{-3}$, and
Hall mobility: 19.2 $cm^2/V \cdot S$.

It is found that, when the plasma irradiation time is extended, the electron carrier concentration is increased correspondingly with the irradiation time.

Then, the driving transistor 20A is configured by using the thus formed active layer 75 as the channel, and the switching transistor 40A is configured by using the active layer 76 as the channel. According to the configuration, the mobility μ of the driving transistor 20A which uses the active layer 75 having the low electron carrier concentration is low, and that of the switching transistor 40A which uses the active layer 76 having the high electron carrier concentration is high. Therefore, the channel length of the driving transistor 20A is shortened to prevent the aperture ratio from being reduced, and the switching transistor 40 is enabled to perform a high-speed switching operation as in the configuration shown in, for example, FIG. 4B.

In the Ar plasma irradiation process such as shown in FIG. 8, many light-emitting cells can be collectively processed. Therefore, the characteristics of the cells are less dispersed, and display unevenness is reduced.

In the examples shown in FIGS. 7 and 8, the case where the amorphous oxide TFTs are configured by using a material having a composition of $InGaZnO_4$ is assumed. Alternatively, the amorphous oxide TFTs may be configured by using a material having an IZO composition.

In the examples shown in FIGS. 7 and 8, the electron carrier concentrations of the active layers 66, 76 and the active layers 65, 75 are differentiated from each other by not performing the UV or Ar plasma irradiation on the active layers 65, 75. Alternatively, the electron carrier concentrations may be differentiated from each other by performing the UV or Ar plasma irradiation on both the active layers 66, 76 and the active layers 65, 75.

In the alternative, for example, after the active layer 65 is covered by a light-blocking mask, only the active layer 66 is irradiated with UV rays, and then, after the active layer 66 is covered by a light-blocking mask, only the active layer 65 is irradiated with UV rays. In the irradiation steps, (the irradiation amount of the UV rays on the active layer 65)<(the irradiation amount of the UV rays on the active layer 66) is set, whereby the electron carrier concentration of the active layer 66 can be made higher than that of the active layer 65.

For example, after the active layer 75 is covered by a light-blocking mask, only the active layer 76 is irradiated with Ar plasma, and then, after the active layer 76 is covered by a light-blocking mask, only the active layer 75 is irradiated with Ar plasma. In the irradiation steps, (the irradiation time of the plasma on the active layer 75)<(the irradiation time of the plasma on the active layer 76) is set, whereby the electron carrier concentration of the active layer 76 can be made higher than that of the active layer 75.

As described above, according to the organic electroluminescent display device of the embodiment, in each of light-emitting cells, the mobility $\mu$ of the driving transistor 20 is smaller than that of the switching transistor 40, and hence the size of the switching transistor 40 can be reduced. As a result, the production cost can be reduced by the size reduction of the switching transistor 40, and the improvement of the aperture ratio due to the size reduction can improve the display brightness.

In the organic electroluminescent display device of the embodiment, in each of light-emitting cells, the active layers of the driving transistor 20 and the switching transistor 40 are formed by an amorphous oxide semiconductor. The use of an amorphous oxide semiconductor enables all of the light-emitting cells to be collectively processed by, for example, UV or plasma irradiation. Therefore, a process for adjusting the mobility can be simplified, and the production cost can be reduced. Moreover, characteristic variations of the cells are reduced, and therefore a high-quality display is enabled. An amorphous oxide semiconductor has a mobility of about 10. Therefore, the current amounts of the driving transistor 20 and the switching transistor 40 can be easily adjusted.

In the organic electroluminescent display device of the embodiment, when the mobility $\mu$ of the driving transistor 20 is reduced, the gradation can be controlled without lowering the program voltage (Vp), whereby a high-quality gradation display in which the noise level is low is enabled. When the gate insulating film of the driving transistor 20 is made relatively thick, the gradation can be controlled without lowering the program voltage (Vp), and the leak current of the gate electrode can be suppressed. Therefore, a high-quality gradation display in which the noise level is low is enabled.

Although the invention has been described above in relation to preferred embodiments and modifications thereof, it will be understood by those skilled in the art that other variations and modifications can be effected in these preferred embodiments without departing from the scope and spirit of the invention.

What is claimed is:

1. A method for producing an organic electroluminescent display device in which a plurality of light-emitting cells each having an organic electroluminescent portion are arranged on a substrate, and, for each of said light-emitting cells, a first transistor which controls energization on said organic electroluminescent portion, and a second transistor which switches a signal to be given to an input of said first transistor are disposed, wherein said method comprises:
    a first step of forming an active layer of said first transistor and an active layer of said second transistor by an amorphous oxide semiconductor, on said substrate; and
    a second step of, after only said active layer of said first transistor is covered by a light-blocking mask, irradiating said active layer of said second transistor with ultraviolet ray or plasma to make an electron carrier concentration of said active layer of said second transistor higher than an electron carrier concentration of said active layer of said first transistor.

2. A method for producing an organic electroluminescent display device in which a plurality of light-emitting cells each having an organic electroluminescent portion are arranged on a substrate, and, for each of said light-emitting cells, a first transistor which controls energization on said organic electroluminescent portion, and a second transistor which switches a signal to be given to an input of said first transistor are disposed, wherein said method comprises:
    a first step of forming an active layer of said first transistor and an active layer of said second transistor by an amorphous oxide semiconductor, on said substrate;
    a second step of, after only said active layer of said first transistor is covered by a light-blocking mask, irradiating said active layer of said second transistor with ultraviolet ray or plasma; and
    a third step of, after only said active layer of said second transistor is covered by a light-blocking mask, irradiating said active layer of said first transistor with ultraviolet ray or plasma, and
    an irradiation amount of the ultraviolet ray or plasma on said active layer of said first transistor is smaller than an irradiation amount of the ultraviolet ray or plasma on said active layer of said second transistor, so that an electron carrier concentration of said active layer of said second transistor is made higher than an electron carrier concentration of said active layer of said first transistor.

* * * * *